(12) United States Patent
Hong

(10) Patent No.: US 9,207,725 B2
(45) Date of Patent: Dec. 8, 2015

(54) DISASSEMBLY MECHANISM FOR RAPIDLY DISASSEMBLING AN EXPANSION CARD

(71) Applicant: Wistron Corporation, New Taipei (TW)

(72) Inventor: Wei-Ling Hong, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 226 days.

(21) Appl. No.: 14/133,561

(22) Filed: Dec. 18, 2013

(65) Prior Publication Data

US 2014/0347808 A1 Nov. 27, 2014

(30) Foreign Application Priority Data

May 22, 2013 (TW) .............................. 102118125 A

(51) Int. Cl.
| | |
|---|---|
| *H05K 7/20* | (2006.01) |
| *G06F 1/18* | (2006.01) |
| *H05K 7/14* | (2006.01) |

(52) U.S. Cl.
CPC .............. *G06F 1/186* (2013.01); *H05K 7/1402* (2013.01); *Y10T 29/53283* (2015.01)

(58) Field of Classification Search
CPC ...................................................... G06F 1/186
USPC ........................................................ 361/754
See application file for complete search history.

(56) References Cited

U.S. PATENT DOCUMENTS

| | | | | |
|---|---|---|---|---|
| 6,549,425 | B1* | 4/2003 | Kosugi ................. | H05K 7/1405 248/316.4 |
| 6,687,134 | B2* | 2/2004 | Vinson .................... | G06F 1/184 211/41.17 |
| 7,364,447 | B1* | 4/2008 | Desrosiers .............. | G06F 1/186 439/157 |
| 8,441,802 | B2* | 5/2013 | Colongo .............. | H05K 7/1409 361/754 |
| 2007/0236899 | A1* | 10/2007 | Dalisay ................ | H05K 7/1409 361/754 |

FOREIGN PATENT DOCUMENTS

TW M373512 2/2010

OTHER PUBLICATIONS

Office Action mailed on Apr. 21, 2015 for the Taiwan application No. 102118125, filing date: May 22, 2013, p. 2 line 4-22 and line 24-26, p. 3 line 1-21 and line 23-26 and p. 4 line 1-18.

* cited by examiner

*Primary Examiner* — Anthony Q Edwards
(74) *Attorney, Agent, or Firm* — Winston Hsu; Scott Margo

(57) ABSTRACT

The present invention discloses a disassembly mechanism including a plate, at least one guiding component, at least one constraining component and a pushing component. The plate is installed on a circuit board of an electronic device, at least one opening and a slot are formed on the plate. The slot sheathes a socket on the circuit board. The at least one guiding component is for guiding the plate to move in a guiding direction. The at least one constraining component is disposed on the at least one guiding component for constraining movement of the plate in the guiding direction. The pushing component is connected to the plate and is for moving with the plate synchronously, so as to push the expansion card to separate from the socket.

20 Claims, 8 Drawing Sheets

DISASSEMBLY MECHANISM FOR RAPIDLY DISASSEMBLING AN EXPANSION CARD

BACKGROUND OF THE INVENTION

1. Field of the Invention

The present invention relates to a disassembly mechanism, and more especially, to a disassembly mechanism for rapidly disassembling an expansion card.

2. Description of the Prior Art

There are hot plug connectors, such as USB connectors and HDMI connectors, disposed on an electronic device, such as a notebook computer or a desktop computer. These connectors are able to be hot plugged when the electronic device is in operation so as to connect to a peripheral expansion module or disassemble a peripheral expansion module without turning off an operating system of the electronic device. However, when disassembling the expansion module from the electronic device in operation manually, the expansion module easily contacts with neighboring electronic components to cause a short circuit, as there are a plurality of electronic components disposed inside the electronic device. It results in the electronic device being wrongly shut down and broken. In addition, the electronic device is designed to be light and thin, and the mechanical space of the electronic device is limited so that it is inconvenient to disassemble the expansion module. In consideration of it, it is a significant issue to design a disassembly mechanism for rapidly disassembling the expansion module inside the electronic device in operation and to prevent the expansion module from contacting the neighboring electronic components nowadays.

SUMMARY OF THE INVENTION

The present invention provides a disassembly mechanism for rapidly disassembling an expansion card, to solve the problems mentioned above.

According to the disclosure, the disassembly mechanism includes a plate, at least one guiding component, at least one constraining component and a pushing component. The plate is installed on a circuit board of an electronic device, at least one opening and a slot are formed on the plate, and the slot sheathes a socket on the circuit board. The at least one guiding component is inserted into the at least one opening, and the at least one guiding component is for guiding the plate to move in a guiding direction. The pushing component is connected to the plate, and the pushing component moves with the plate synchronously as the plate moves in the guiding direction, so as to push the expansion card to separate from the socket.

According to the disclosure, the disassembly mechanism further includes a handle structure disposed on a side of the plate away from the circuit board.

According to the disclosure, the handle structure includes a handle portion and at least one fixing portion. The handle portion is movably connected to the plate, and at least one track is disposed on the handle portion. The at least one fixing portion is installed inside the at least one track, and the least one fixing part is for fixing the handle portion on the plate.

According to the disclosure, a bottom of the expansion card contacts against the pushing component According to the disclosure, the disassembly mechanism further includes a base disposed between the plate and the circuit board.

According to the disclosure, the disassembly mechanism further includes a recovering component. The recovering component sheathes on the at least one constraining component and is disposed between the at least one constraining component and the plate. The at least one constraining component is for providing elastic recovering force to the plate to recover the plate to an initial position after the pushing component moves in the guiding direction to push the expansion card to separate from the socket.

According to the disclosure, the plate and the pulling component are integrally formed and made of insulating material.

According to the disclosure, the disassembly mechanism further includes a guiding structure disposed on a side of the plate for guiding the plate to move in the guiding direction, and the guiding structure is a slot structure. A side of the plate is installed inside the slot structure movably in the guiding direction.

According to the disclosure, the guiding structure includes a pillar and a guiding slot. The guiding slot is formed on a side of the plate and sheaths the pillar. The guiding slot is for guiding the plate to move in a guiding direction.

According to the disclosure, an electronic device includes a casing, a circuit board, a socket, an expansion card and a disassembly mechanism. The circuit board is disposed in the casing. The socket is disposed on the circuit board. The expansion card is detachably installed on the socket. The disassembly mechanism is disposed in the casing and includes a plate, at least one guiding component, at least one constraining component and a pushing component. The plate is installed in the circuit board of the electronic device. At least one opening and a slot are formed on the plate, and the slot sheathes the socket of the circuit board. The at least one guiding component is for guiding the plate to move in a guiding direction. The at least one constraining component is disposed on the at least one guiding component for constraining a movement of the plate in the guiding direction. The pushing component is connected to the plate and moves with the plate synchronously as the plate moves in the guiding direction, so as to push the expansion card to separate from the socket.

The present invention provides the disassembly mechanism for rapidly disassembling the expansion card. When disassembling the expansion card, the plate is pulled so that the pushing component connected to the plate separates the expansion card from the socket, so as to facilitate a user to disassemble the expansion card in a limited space conveniently. In addition, the insulating plate is disposed on the socket to prevent the expansion card from contacting with neighboring expansion cards as disassembling the expansion card from the electronic device in operation. It can solve a conventional problem that the expansion card easily contacts with neighboring electronic components, resulting in a short circuit so that the electronic device is wrongly shut down and broken as the expansion card is disassembled manually.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
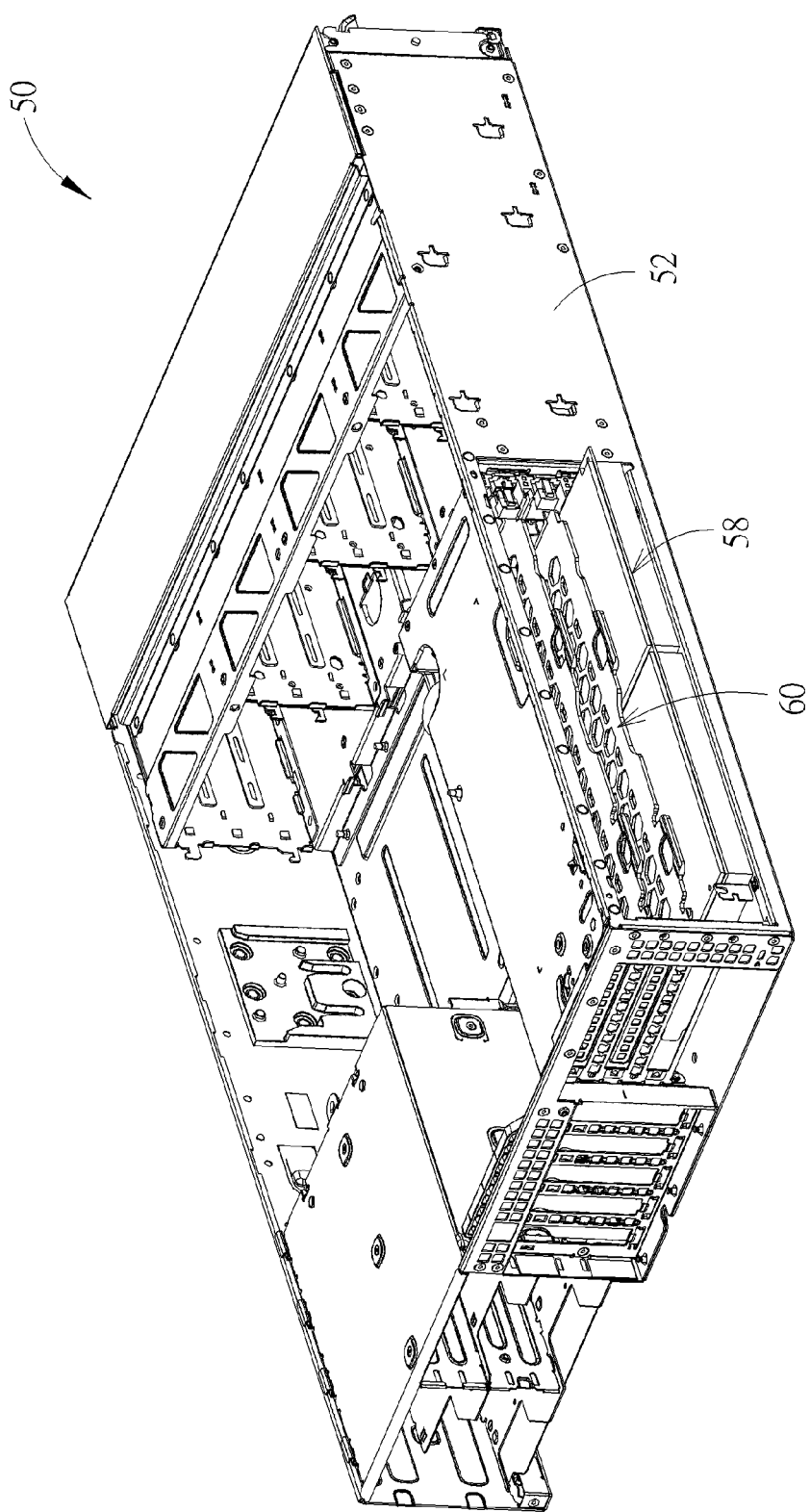
FIG. 1 is an internal structural diagram of an electronic device according to an embodiment of the present invention.
Figure 2:
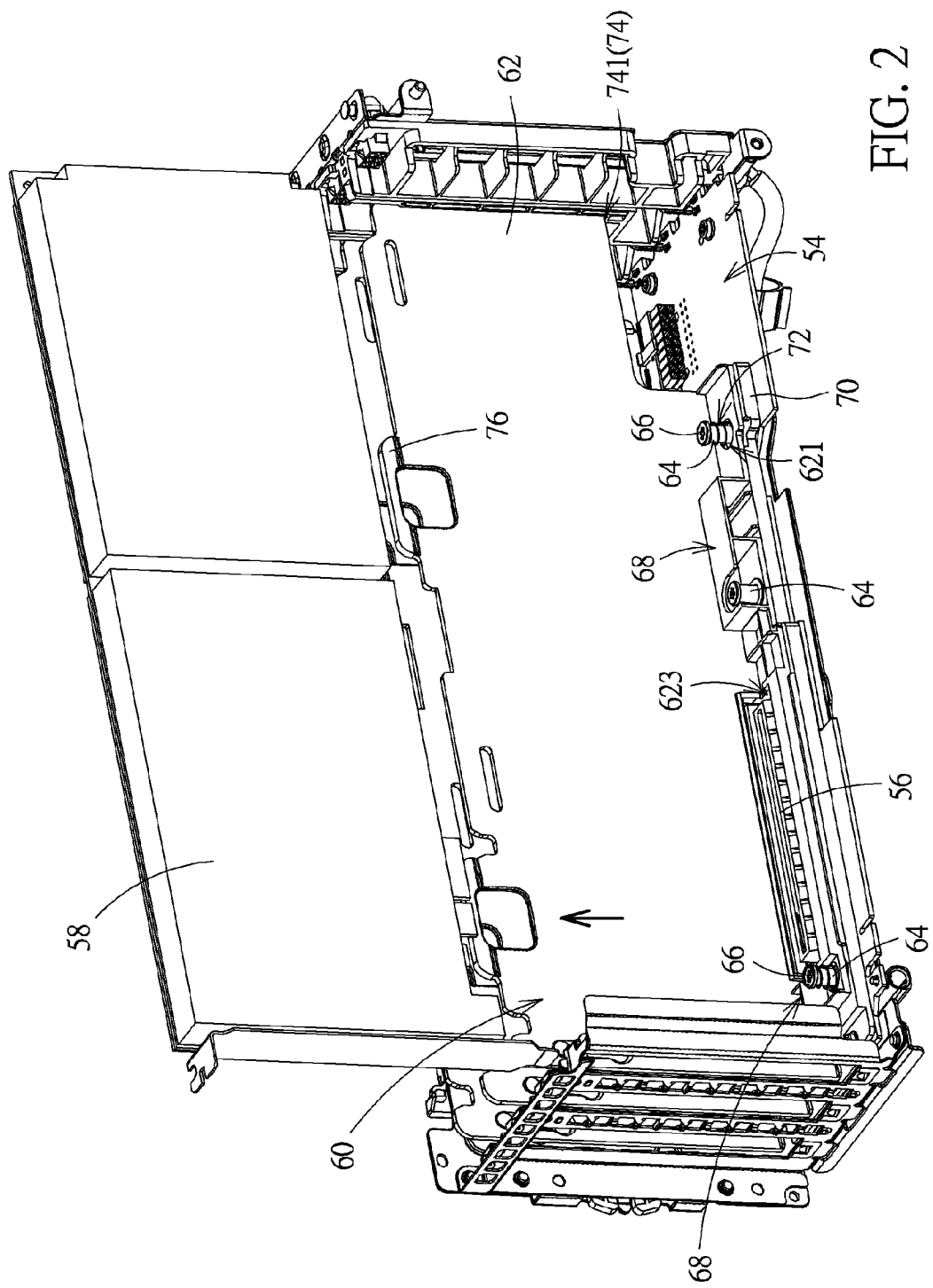
FIG. 2 and FIG. 3 are partial structural diagrams of the electronic device in different view angles according to the embodiment of the present invention.
Figure 3:
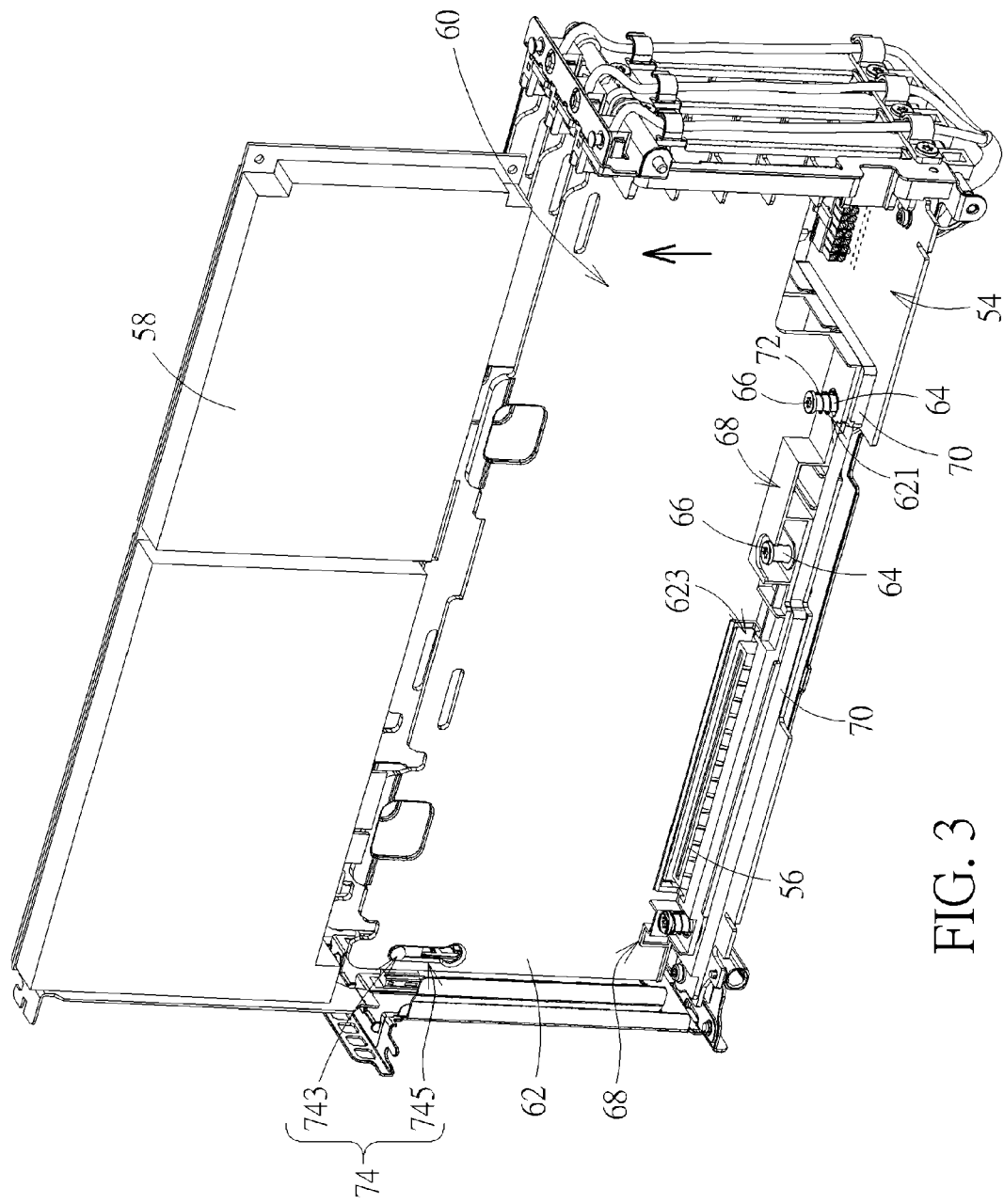

Please refer to FIG. 1 to FIG. 3. FIG. 1 is an internal structural diagram of an electronic device 50 according to an embodiment of the present invention. FIG. 2 and FIG. 3 are partial structural diagrams of the electronic device 50 in different view angles according to the embodiment of the present invention. The electronic device 50 according to the embodiment of the present invention can be a desktop computer or a server computer. The electronic device 50 includes a casing 52, a circuit board 54, a socket 56, an expansion card 58 and a disassembly mechanism 60. The casing 52 is for covering inner electronic components, such as a CPU, hard discs, fans, memory sticks and expansion cards. The circuit board 54 is disposed in the casing 52, and the circuit board 54 can be a motherboard. The socket 56 is disposed on the circuit board 54, and the expansion card 58 is detachably installed on the socket 56. The expansion card 58 can be various interface cards, such as a graphic card, a Peripheral Component Interconnect Express (PCIE) card, and so on. As the expansion card 58 is the PCIE card, the socket 56 is a PCIE socket corresponding to the PCIE card. The disassembly mechanism 60 is disposed in the casing 52 for facilitating a user to disassemble the expansion card 58 and preventing the expansion card 58 from contacting neighboring electronic components, such as another expansion card 58, resulting in a short circuit so that the electronic device 50 is wrongly shut down and broken during the disassembling process.

The disassembly mechanism 60 includes a plate 62, at least one guiding component 64, at least one constraining component 66 and a pushing component 68. The plate 62 is installed on the circuit board 54 of the electronic device 50. At least one opening 621 and a slot 623 are formed on the plate 62, and the slot 623 sheathes the socket 56 of the circuit board 54. The at least one guiding component 64 is inserted into the at least one opening 621 for guiding the plate 62 to move in a guiding direction illustrated in an arrow as shown in FIG. 2 and FIG. 3. The constraining component 66 is disposed on the guiding component 64 for constraining movement of the plate 62 in the guiding direction. The guiding component 64 can be a pillar and the constraining component 66 can be a screw, but it is not limited to this. The disassembly mechanism 60 includes three guiding components 64 and three constraining components 66 in this embodiment, but it is not limited to this. The amount and the position of the guiding components 64 and the constraining components 66 depend on the practical requirements. The pushing component 68 is connected to the plate 62, and a bottom of the expansion card 58 contacts against the pushing component 68 so that the pushing component 68 can move with the plate 62 synchronously as the plate 62 moves in the guiding direction, so as to push the expansion card 58 to separate from the socket 56. The plate 62 and the pushing component 68 can be integrally formed and made of insulating material so as to insulate from the expansion card 58 and effectively isolate the neighboring expansion card 58.

The disassembly mechanism 60 further includes a base 70 disposed between the plate 62 and the base 54. Three guiding components 64 are disposed on the base 70 in this embodiment. In addition, the three guiding components 64 can be disposed on the casing 52 and inserted into the base 70 and the circuit board 54. The disassembly mechanism 60 further includes a recovering component 72. The recovering component 72 sheaths on the at least one guiding component 64 and disposed between the at least one constraining component 66 and the plate 62, and the at least recovering component 72 is for providing elastic recovering force to the plate 62 to recover the plate 62 to an initial position after the pushing component 68 moves in the guiding direction to push the expansion card 58 to separate from the socket 56. The disassembly mechanism 60 further includes a guiding structure 74 disposed on a side of the plate 62. The guiding structure 74 is for guiding the plate 62 to move in the guiding direction. As shown in FIG. 2, the guiding structure 74 includes a slot structure 741, and a side of the plate 62 is installed inside the slot structure 741 movably in the guiding direction. As shown in FIG. 3, the guiding structure 74 can further include a pillar 743 and a guiding slot 745 formed on a side of the plate 62 of the plate and sheathing the pillar 743. The guiding slot 745 is for guiding the plate 62 to move in the guiding direction. The slot structure 741 disposed on the plate 62 and the cooperation of the pillar 743 and the guiding slot 745 can guide the plate 62 to move in the guiding direction cooperatively in this embodiment.

Figure 4:
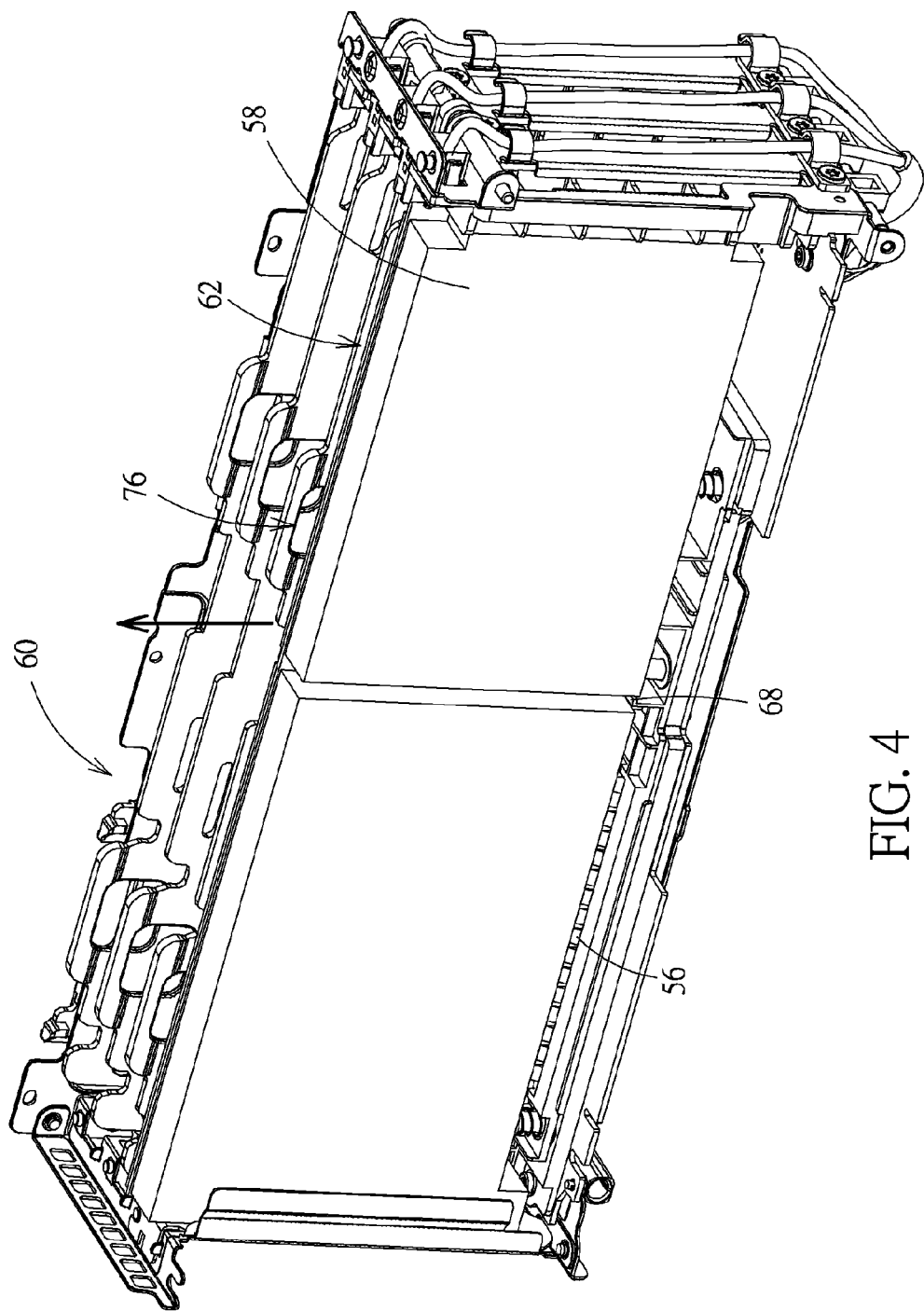
FIG. 4 is a diagram illustrating an expansion card having been installed in a socket according to the embodiment of the present invention.
Figure 5:
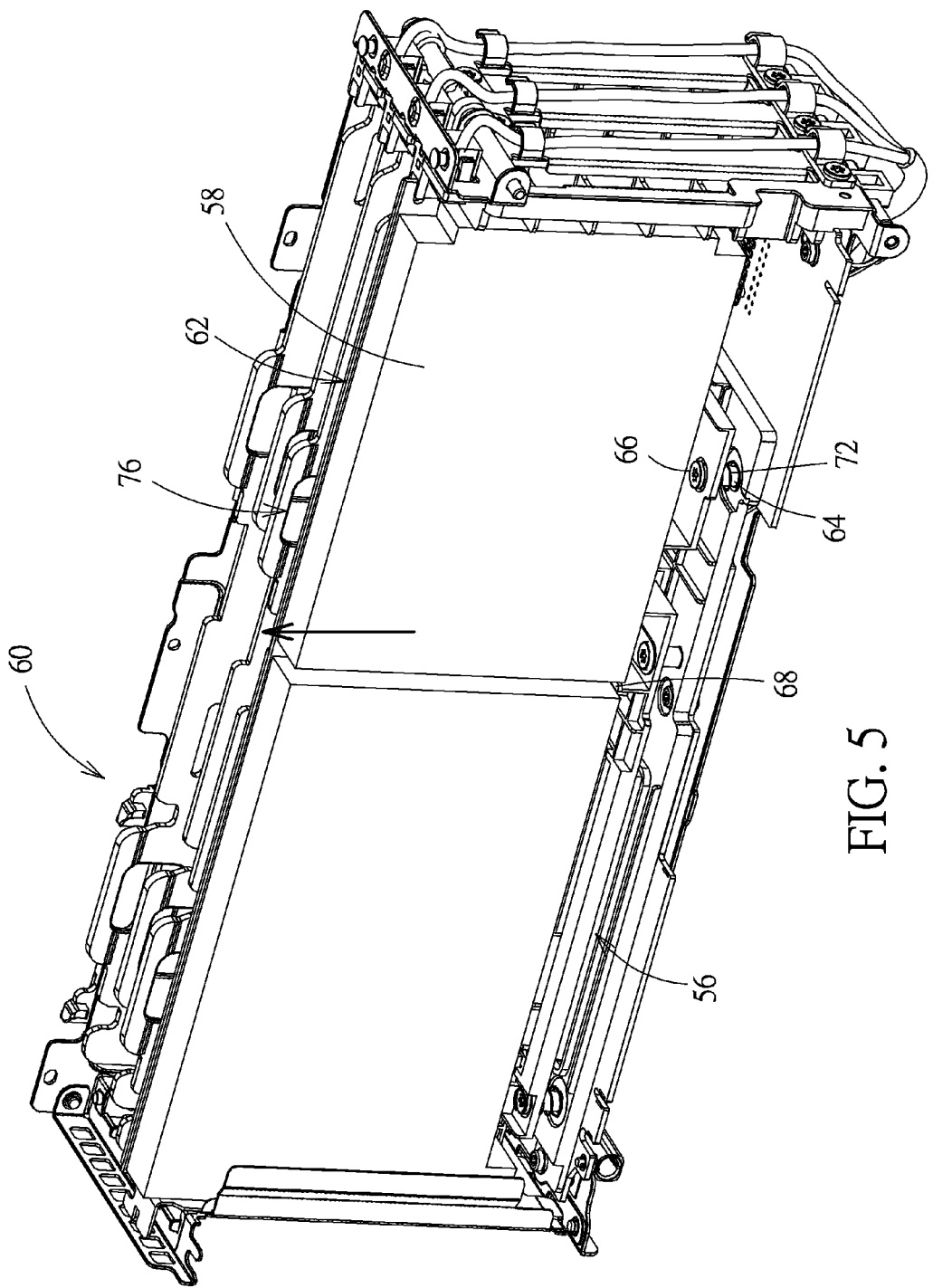
FIG. 5 is a diagram illustrating a disassembly mechanism pushing the expansion card to separate from the socket according to the embodiment of the present invention.
Figure 6:
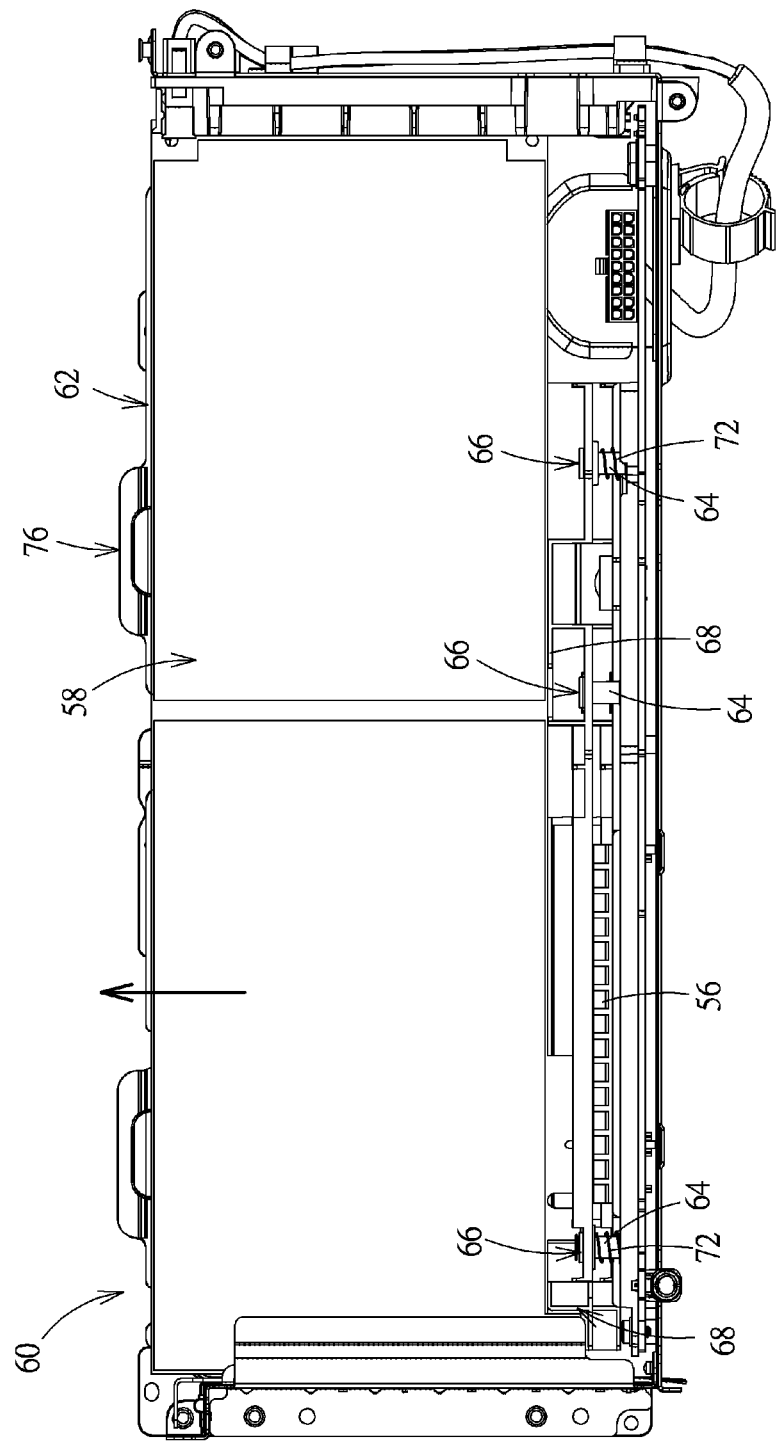
FIG. 6 is a front view illustrating the disassembly mechanism pushing the expansion card to separate from the socket according to the embodiment of the present invention.

A process of assembling and disassembling the expansion card 58 is described as follows. Please refer to FIG. 2 and FIG. 6, the FIG. 4 is a diagram illustrating the expansion card 58 having been installed in the socket 56 according to the embodiment of the present invention. FIG. 5 is a diagram illustrating the disassembly mechanism 60 pushing the expansion card 58 to separate from the socket 56 according to the embodiment of the present invention. FIG. 6 is a front view illustrating the disassembly mechanism 60 pushing the expansion card 58 to separate from the socket 56 according to the embodiment of the present invention. When it is desired to install the expansion card 58 on the socket 56, the expansion card 58 is aligned to the socket 56 and then inserted into the socket 56 downwardly as shown in FIG. 2 and FIG. 3. As shown in FIG. 4, the expansion card 58 is installed in the socket 56, and the bottom of the expansion card 58 contacts against the pushing component 68. As shown in FIG. 2 to FIG. 4, the plate 62 further includes a handle structure 76 disposed on a side of the plate 62 away from the circuit board 54. When it is desired to separate the expansion card 58 from the socket 56, a user can hold the handle structure 76 for pulling the plate 62 to move in the guiding direction. The slot structure 741 and the guiding slot 745 both guide the plate 62 to move stably in the guiding direction as the plate 62 moves in the guiding direction. As shown in FIG. 5 and FIG. 6, the pushing component 68 moves with the plate synchronously and contacts against the bottom of the expansion card 58 so as to push the expansion card 58 to move in the guiding direction. As the plate 62 moves to a position corresponding to the constraining component 66, the plate 62 is constrained in the guiding direction by the constraining component 66 and is not able to move in the in the guiding direction, so that the expansion card 58 is separated form the socket 56. Once the expansion card 58 is separated form the socket 56 and no more force is applied to the handle structure 76, the recovering component 72 disposed between the constraining component 66 and the plate 62 provides an elastic recovering force to the plate 62 to recover the plate 62 to an initial position, as shown in FIG. 2.

Figure 7:
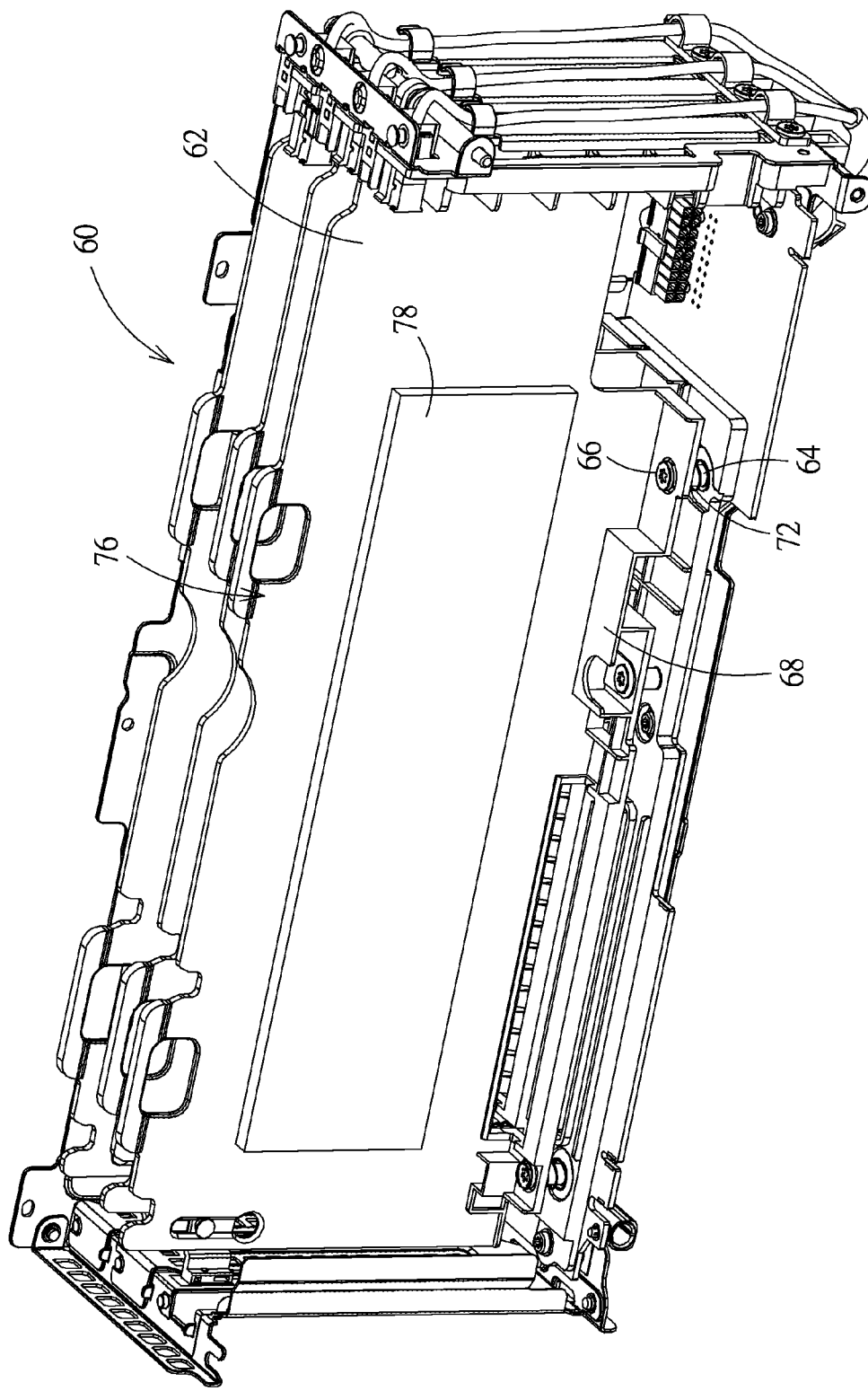
FIG. 7 is a diagram of a disassembly mechanism according to another embodiment of the present invention.

Please refer to FIG. 7. FIG. 7 is a diagram of the disassembly mechanism 60 according to another embodiment of the present invention. The plate 62 can be made of metal material, and two insulating components 78 are respectively disposed on two sides of the plate 62 according to the embodiment. The plate 62 is made of metal material so as to increase the structural strength of the plate 62. For preventing the expansion card 58 from contacting with neighboring electronic components so as to cause a short circuit, the two insulating components 78 are disposed on the two sides of the plate 62.

Figure 8:
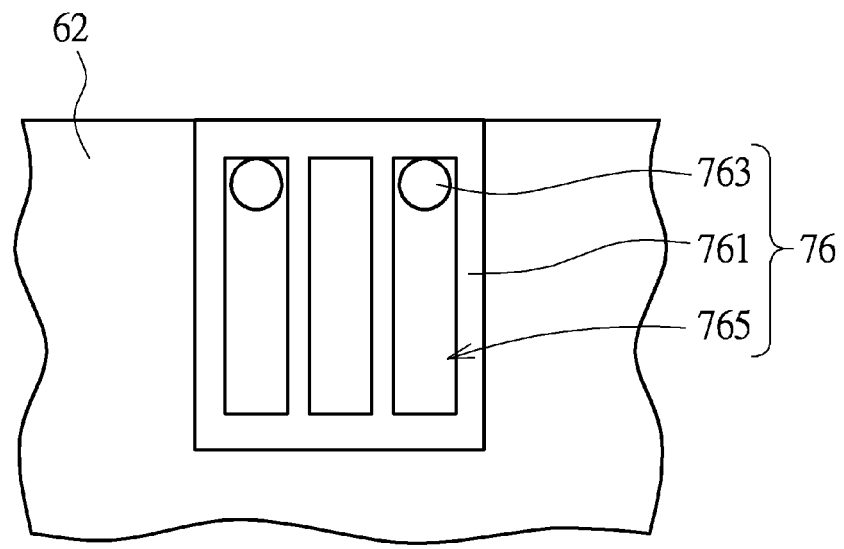
FIG. 8 and FIG. 9 are diagrams of a handle structure in different states according to another embodiment of the present invention.
Figure 9:
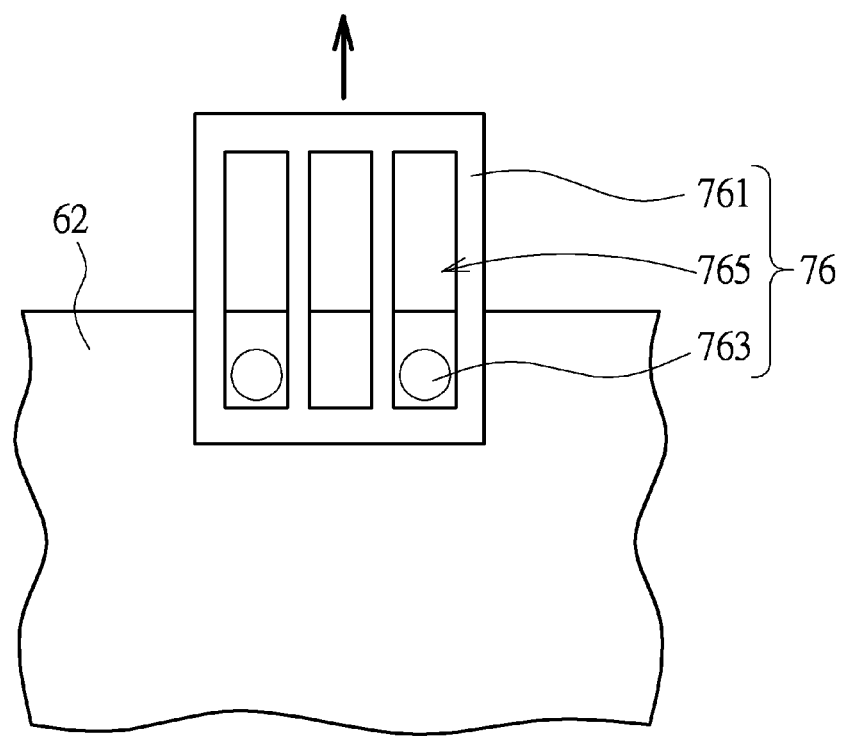

Please refer to FIG. 8 and FIG. 9. FIG. 8 and FIG. 9 are diagrams of a handle structure 76 in different states according to another embodiment of the present invention. According to this embodiment, the handle structure 76 includes a handle portion 761 and at least one fixing portion 763. The handle portion 761 is connected to the plate 62 and is able to move relative to the plate 62. At least one track 765 is disposed on the handle portion 761. The at least one fixing portion 763 is installed on the at least one track 765 for fastening the handle portion 761 on the plate 62. In this embodiment, the handle structure 76 includes two fixing portions 763 disposed on the two sides of the handle portion 761. Two tracks 765 are disposed on the handle portion 761 for sheathing the two fixing portion 763 respectively. As the handle structure 76 is not used, the handle portion 761 can move down by its gravity so that a top of the handle portion 761 is aligned with a top of the plate 62, as shown in FIG. 8, so that the handle structure 76 occupies less space. When it is desired to use the handle structure 76, the handle portion 761 is pulled up so that the handle portion 761 slides upwardly relative to the plate 62 along the two tracks 765 until a bottom of each track 765 contacts the corresponding fixing portion 763. The plate 62 is driven to move in the guiding direction by the handle portion 761. As shown in FIG. 5, the expansion card 58 can be separated from the socket 56 by the plate 62 and the pushing component 68. It should be noticed that, as shown in FIG. 1 to FIG. 5, a plurality of socket 56 can be disposed in the electronic device 50, and a plurality of disassembly mechanism 60 can be correspondingly disposed in the electronic device 50 for respectively disassembling the corresponding expansion card 58.

In contrast to the prior art, the present invention provides the disassembly mechanism for rapidly disassembling the expansion card. When disassembling the expansion card, the plate is pulled so that the pushing component connected to the plate separates the expansion card from the socket, so as to facilitate the user to disassemble the expansion card in a limited space conveniently. In addition, the insulating plate is disposed on the socket to prevent the expansion card from contacting with neighboring expansion cards as disassembling the expansion card from the electronic device in operation. It can solve a conventional problem that the expansion card easily contacts with neighboring electronic components, resulting in a short circuit so that the electronic device is wrongly shut down and broken as the expansion card is disassembled manually.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A disassembly mechanism for rapidly disassembling an expansion card, the disassembly mechanism comprising:

a plate installed on a circuit board of an electronic device, at least one opening and a slot being formed on the plate, and the slot sheathing a socket on the circuit board;

at least one guiding component inserted into the at least one opening, the at least one guiding component being for guiding the plate to move in a guiding direction;

at least one constraining component disposed on the at least one guiding components, the at least one constraining component being for constraining movement of the plate in the guiding direction; and a pushing component connected to the plate, the pushing component moving with the plate synchronously as the plate moves in the guiding direction, so as to push the expansion card to separate from the socket.

2. The disassembly mechanism of claim 1, further comprising a handle structure disposed on a side of the plate away from the circuit board.

3. The disassembly mechanism of claim 2, wherein the handle structure comprising:

a handle portion movably connected to the plate, at least one track being disposed on the handle portion; and at least one fixing portion installed inside the at least one track, the least one fixing part being for fixing the handle portion on the plate.

4. The disassembly mechanism of claim 1, wherein a bottom of the expansion card contacts against the pushing component.

5. The disassembly mechanism of claim 1, further comprising a base disposed between the plate and the circuit board.

6. The disassembly mechanism of claim 1, further comprising a recovering component sheathing on the at least one guiding component and disposed between the at least one constraining component and the plate, the at least one constraining component being for providing elastic recovering force to the plate to recover the plate to an initial position after the pushing component moves in the guiding direction to push the expansion card to separate from the socket.

7. The disassembly mechanism of claim 1, wherein the plate and the pulling component are integrally formed and made of insulating material.

8. The disassembly mechanism of claim 1, wherein the plate is made of metal material, and two insulating components are respectively disposed on two sides of the plate.

9. The disassembly mechanism of claim 1, further comprising a guiding structure disposed on a side of the plate for guiding the plate to move in the guiding direction, the guiding structure is a slot structure, and a side of the plate is installed inside the slot structure movably in the guiding direction.

10. The disassembly mechanism of claim 9, wherein in the guiding structure comprises:

a pillar; and a guiding slot formed on a side of the plate and sheathing the pillar, the guiding slot being for guiding the plate to move in the guiding direction.

11. An electronic device, comprising:

a casing;

a circuit board disposed in the casing;

a socket disposed on the circuit board;

a disassembly mechanism disposed in the casing, the disassembly mechanism comprising:

a plate installed on the circuit board of the electronic device, at least one opening and a slot being formed on the plate and the slot sheathing a socket on the circuit board;

at least one guiding component inserted into the at least one opening, the at least one guiding component being for guiding the plate to move in a guiding direction;

at least one constraining component disposed on the at least one guiding components, the at least one constraining component being for constraining movement of the plate in the guiding direction; and a pushing component connected to the plate, the pushing component moving with the plate synchronously as the plate moves in the guiding direction, so as to push the expansion card to separate from the socket.

12. The electronic device of claim 11, further comprising a handle structure disposed on the side of the plate away from the circuit board.

13. The electronic device of claim 12, wherein the handle structure comprises:

a handle portion movably connected to the plate, at least one track being disposed on the handle portion; and at least one fixing portion installed inside the at least one track, the least one fixing part being for fixing the handle portion on the plate.

14. The electronic device claim 11, wherein a bottom of the expansion card contacts against the pushing component.

15. The electronic device of claim 11, further comprising a base disposed between the plate and the circuit board.

16. The electronic device of claim 11, further comprising a recovering component sheathing on the at least one guiding component and disposed between the at least one constraining component and the plate, the at least one constraining component being for providing elastic recovering force to the plate to recover the plate to an initial position after the pushing component moves in the guiding direction to push the expansion card to separate from the socket.

17. The electronic device of claim 11, wherein the plate and the pulling component are integrally formed and made of insulating material.

18. The electronic device of claim 11, wherein the plate is made of metal material, and two insulating components are respectively disposed on two sides of the plate.

19. The electronic device of claim 11, further comprising a guiding structure disposed on a side of the plate for guiding the plate to move in the guiding direction, the guiding structure is a slot structure, and a side of the plate is installed inside the slot structure movably in the guiding direction.

20. The electronic device of claim 19, wherein in the guiding structure comprises:

a pillar; and a guiding slot formed on a side of the plate and sheathing the pillar, the guiding slot being for guiding the plate moving in the guiding direction.

* * * * *